United States Patent
Hosaka et al.

(10) Patent No.: US 6,974,615 B2
(45) Date of Patent: Dec. 13, 2005

(54) BINDING MEMBER FOR COAXIAL CABLE AND AN ELECTRIC CONNECTOR FOR COAXIAL CABLE BOTH USING RESIN SOLDER, AND A METHOD OF CONNECTING THE BINDING MEMBER TO COAXIAL CABLE OR THE ELECTRIC CONNECTOR

(75) Inventors: Taiji Hosaka, Yokohama (JP); Masaaki Miyazawa, Kawasaki (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/114,198

(22) Filed: Apr. 1, 2002

(65) Prior Publication Data

US 2002/0142653 A1  Oct. 3, 2002

(30) Foreign Application Priority Data

Mar. 30, 2001 (JP) ........................................ 2001-102645

(51) Int. Cl.⁷ ........................... H01R 9/05; H01R 4/02; H01R 12/04; H05K 1/11; B32B 1/08
(52) U.S. Cl. ...................... 428/36.9; 428/344; 428/458; 428/901; 439/578; 439/874; 439/583; 439/584; 439/585; 174/257; 174/263
(58) Field of Search ................................ 428/36.9, 344, 428/458, 901; 439/578, 584, 585, 874, 583; 174/257, 263

(56) References Cited

U.S. PATENT DOCUMENTS

| | | |
|---|---|---|
| 3,660,726 A | 5/1972 | Ammon et al. ............. 317/101 |
| 3,822,107 A | 7/1974 | Wogerer |
| 3,914,081 A | 10/1975 | Aoki |
| 3,971,610 A | 7/1976 | Buchoff et al. |
| 3,978,378 A | 8/1976 | Tigner et al. |
| 4,315,724 A | 2/1982 | Taoka et al. ................ 425/130 |
| 4,398,785 A | 8/1983 | Hedrick ...................... 339/196 |
| 4,666,547 A | 5/1987 | Snowden, Jr. et al. ...... 156/280 |
| 4,778,556 A | 10/1988 | Wery et al. |
| 4,838,799 A | 6/1989 | Tonooka ...................... 439/70 |

(Continued)

FOREIGN PATENT DOCUMENTS

| | | |
|---|---|---|
| DE | 3824314 | 2/1989 |
| DE | 3914959 | 11/1989 |
| DE | 4012061 | 10/1991 |
| DE | 19808178 | 9/1998 |

(Continued)

OTHER PUBLICATIONS

Machine translation of JP 10–237331 provided in IDS.*
"Electric Connecting Device and Electric Connector Using Resin Solder and Method of Connecting Electric Wire to Them". by Taiji Hosaka et al.; U.S. Appl. 10/114,799, Apr. 1, 2002. pp. 1 to 48 and 30 sheets of drawings.

(Continued)

*Primary Examiner*—Harold Pyon
*Assistant Examiner*—Chris Bruenjes
(74) *Attorney, Agent, or Firm*—W. F. Fasse; W. G. Fasse

(57) ABSTRACT

To easily connect a coaxial cable to electric connecting devices or a printed circuit board, to prevent the conductors of the cable from being disturbed, to secure the shielding performance of the signal line, and to enable connection of a very fine wire by means of an automatic machine, a binding member for a coaxial cable is formed into a tubular piece that is arranged to cover the outer conductor or the centered conductor which is exposed from the insulating covering of the cable. This binding member is made of a lead-free ultrahigh-conductive plastic resin composite. An electric connector for a coaxial cable has electric contacts, which each have a receiving port into which the binding member is inserted.

11 Claims, 13 Drawing Sheets

U.S. PATENT DOCUMENTS

| | | | |
|---|---|---|---|
| 4,863,392 A | 9/1989 | Borgstrom et al. | |
| 4,926,548 A | 5/1990 | Hopkins et al. | 29/860 |
| 5,129,143 A | 7/1992 | Wei et al. | |
| 5,163,856 A | 11/1992 | McGaffigan et al. | |
| 5,347,711 A | 9/1994 | Wheatcraft et al. | |
| 5,357,074 A | 10/1994 | Pawlikowski | 219/85.18 |
| 5,386,085 A | 1/1995 | Miehls et al. | |
| 5,427,546 A | 6/1995 | Garritano et al. | 439/502 |
| 5,517,747 A | 5/1996 | Pierro et al. | |
| 5,558,538 A * | 9/1996 | Delalle | 439/583 |
| 5,626,483 A | 5/1997 | Naitoh | |
| 5,656,798 A | 8/1997 | Kubo et al. | 174/265 |
| 5,673,480 A | 10/1997 | Buchheister, Jr. et al. | 29/843 |
| 5,772,454 A | 6/1998 | Long, Jr. | 439/83 |
| 5,800,211 A * | 9/1998 | Stabile et al. | 439/578 |
| 5,898,991 A | 5/1999 | Fogel et al. | |
| 5,959,829 A | 9/1999 | Stevenson et al. | |
| 5,969,952 A | 10/1999 | Hayashi et al. | 361/774 |
| 6,137,056 A | 10/2000 | Miyazaki | 174/78 |
| 6,159,046 A * | 12/2000 | Wong | 439/578 |
| 6,163,957 A | 12/2000 | Jiang et al. | |
| 6,176,744 B1 | 1/2001 | Zito et al. | |
| 6,179,631 B1 | 1/2001 | Downes et al. | 439/83 |
| 6,183,298 B1 * | 2/2001 | Henningsen | 439/578 |
| 6,183,311 B1 | 2/2001 | Suess et al. | |
| 6,194,669 B1 | 2/2001 | Bjorndahl et al. | |
| 6,239,385 B1 * | 5/2001 | Schwiebert et al. | 174/261 |
| 6,239,386 B1 | 5/2001 | DiStefano et al. | |
| 6,247,977 B1 | 6/2001 | Tanaka et al. | |
| 6,274,820 B1 | 8/2001 | DiStefano et al. | |
| 6,342,680 B1 * | 1/2002 | Nakagawa et al. | 174/257 |
| 6,388,204 B1 | 5/2002 | Lauffer et al. | |
| 6,465,084 B1 | 10/2002 | Curcio et al. | |
| 6,638,607 B1 | 10/2003 | Curcio et al. | |

FOREIGN PATENT DOCUMENTS

| | | |
|---|---|---|
| DE | 19937100 | 2/2000 |
| EP | 0576785 | 1/1994 |
| EP | 0831565 | 3/1998 |
| GB | 256377 | 8/1926 |
| GB | 2218580 | 11/1989 |
| GB | 2340674 | 2/2000 |
| JP | 09274972 | 10/1997 |
| JP | 10237331 | 9/1998 |
| JP | 2597015 | 4/1999 |
| WO | WO97/50149 | 12/1997 |

OTHER PUBLICATIONS

"An Electric Connector for Twisted Pair Cable Using Resin Solder and a Method of Connecting Electric Wire to the Electric Connector"; by Taiji Hosaka et al.; U.S. Appl. 10/114,197, Apr. 1, 2002; pp. 1 to 33 and 6 sheets of drawings.

"A Pair of Electric Connectors Using Resin Solder in One Connector", by Taiji Hosaka et al.; U.S. Appl. 10/114,196; Apr. 1, 2002; pp. 1 to 32 and 10 sheets of drawings.

An Electric Contact and an Electric Connector Both Using Resin Solder and a Method of Connecting Them to a Printed Circuit Board by Taiji Hosaka et al.; U.S. Appl. 10/114,188; pp. 1 to 39 and 11 sheets of drawings.

An Electric Contact and an Electric Connector Both Using Resin Solder and a Method of Connecting Them to A Printed Circuit Board by Taiji Hosaka et al., U.S. Appl. 10/114,775; Apr. 1, 2002; pp. 1 to 46 and 18 sheets of drawings.

* cited by examiner

BINDING MEMBER FOR COAXIAL CABLE AND AN ELECTRIC CONNECTOR FOR COAXIAL CABLE BOTH USING RESIN SOLDER, AND A METHOD OF CONNECTING THE BINDING MEMBER TO COAXIAL CABLE OR THE ELECTRIC CONNECTOR

CROSS-REFERENCE TO RELATED APPLICATIONS

This application is related to our copending U.S. patent applications Ser. Nos. 10/114,188; 10/114,196; 10/114,197; 10/114,775; and 10/114,799; all filed on Apr. 1, 2002.

BACKGROUND OF THE INVENTION

1. Field of the Invention

The present invention belongs to a field of technology for connecting a coaxial cable, wherein a centered conductor and an outer conductor are arranged coaxially and each conductor is covered by an insulating covering, to another member at one end of the coaxial cable.

2. Related Art

When a coaxial cable is to be connected, at one end thereof, to electric connecting devices such as terminals and electric contacts or a printed circuit board, the insulating coverings of the coaxial cable are removed at the end thereof, and the exposed outer conductor and the exposed centered conductor are soldered to electric connecting devices or a printed circuit board.

When the outer conductor and the centered conductor are to be soldered to electric connecting devices or a printed circuit board, the conductor is placed on the electric connecting device or the printed circuit board and molten solder is applied to them. However, if a conductor is to be soldered to, for example, a recess of an electric connector, or if a conductor is to be soldered to an inner part of a printed circuit board in three-dimensional packaging, it is difficult or impossible to solder because an adequate space for soldering can not be secured. Moreover, the work of applying solder requires delicate quality control, temperature control and the like of the solder, and the control man-hour increases correspondingly.

The conductors tend to be disturbed. If the conductors are disturbed, the workability of soldering will deteriorate. Moreover, if the outer conductor is disturbed, the shielding performance will deteriorate in proportion to the disturbance of the conductor.

When the centered conductor is a very fine wire (for example, American Wire Gauge size 36 falls in the category of very fine wire, and the diameter of this electric wire is 0.12 mm approximately.), the work of applying molten solder to the contacting parts of both the conductor and the electric connecting device or the printed circuit board can not be done by an automatic machine, and it is inevitable to do the work manually by a skilled worker. Hence the productivity is low and this results in an increase in cost.

Japanese Patent unexamined publication gazette Heisei 10-237331 discloses a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal.

SUMMARY OF THE INVENTION

This lead-free ultrahigh-conductive plastic exhibits a high conductivity, for example, $10^{-3} \Omega \cdot cm$ or under in volume resistivity. Moreover, this material can be formed by injection molding and has a high degree of formability. As this material contains solder, there is no need of separately applying solder. One objective of the present invention is to provide a binding member for coaxial cable and an electric connector for coaxial cable both using resin solder and a method of connecting the binding member to coaxial cable or the electric connector, which can solve the above-mentioned problems, by using the lead-free ultrahigh-conductive plastic that has such excellent conductivity and formability and contains solder.

To accomplish the above-mentioned objective, a binding member for coaxial cable using resin solder according to the present invention is formed into a tubular piece which covers an outer conductor or a centered conductor being exposed from an insulating covering, and is made of a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal.

This binding member is made to cover the outer conductor or the centered conductor being exposed from the insulating covering. When the contacting parts of both the binding member and the conductor are heated, the lead-free solder being contained in the lead-free ultrahigh-conductive plastic of the binding member will melt out to stick to the conductor. When the solder cools and solidifies, the binding member will be connected to the conductor.

When the binding member being connected to the coaxial cable is placed on an electric connecting device or a printed circuit board and the contacting parts of both the binding member and the device or the board are heated, the lead-free solder being contained in the lead-free ultrahigh-conductive plastic of the binding member will melt out to stick to the electric connecting device or the printed circuit board. When the solder cools and solidifies, the binding member will be connected to the electric connecting device or the printed circuit board. This will connect the coaxial cable to the electric connecting device or the printed circuit board.

In this case, when the coaxial cable is to be connected to the electric connecting device or the printed circuit board, the work of separately applying solder is not required. Accordingly, even if an adequate space for the soldering work can not be secured, the coaxial cable can be easily connected to the electric connecting device or the printed circuit board. Moreover, as solder quality control, temperature control and the like are not required, the control man-hour is reduced correspondingly. Furthermore, as the binding member circumferentially covers the outer conductor or the centered conductor to prevent the outer conductor or the centered conductor from being disturbed, the outer conductor or the centered conductor can be easily connected to the electric connecting device or the printed circuit board. Thus the workability is good, and as the binding member has conductivity, the shielding performance of the signal line is secured. Further, connection of a very fine wire can be done by an automatic machine, and the productivity is enhanced and the cost is reduced. The lead-free ultrahigh-conductive plastic exhibits high conductivity, as high as $10^{-3} \Omega \cdot cm$ or under in volume resistivity. Hence the electric resistance of the binding member can be reduced. After the connection of the coaxial cable, when electricity is passed at a normal level, the lead-free ultrahigh-conductive plastic will not melt due to heat generation. Moreover, in comparison with the technology of MID (Molded Interconnection Device; for example, refer to Utility Model Gazette No. 2597015) wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This in turn allows passage of a larger current. As the lead-free ultrahigh-conductive plastic can be formed by injection molding, the binding member can be directly formed by injection molding. As it has a greater freedom of molding, the binding member can be molded into a variety of configurations according to the application. This makes it easier to obtain impedance matching.

DESCRIPTION OF PREFERRED EMBODIMENTS OF THE INVENTION

Figure 1:
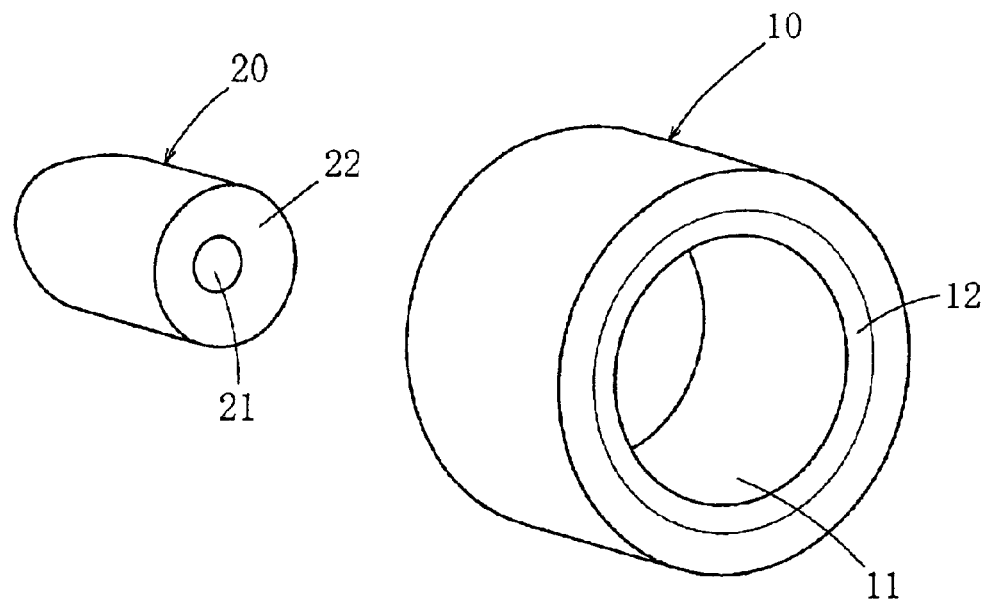
FIG. 1 is a perspective view of the binding members of the first embodiment according to the present invention.

In the following, some embodiments of the binding member for coaxial cable and the electric connector for coaxial cable both using resin solder and the method of connecting the binding member to coaxial cable or the electric connector according to the present invention will be described.

First, the above-mentioned lead-free ultrahigh-conductive plastic, which is commonly used in all the embodiments of the present invention, will be described in detail according to the description of Japanese Patent unexamined publication gazette Heisei 10-237331. This lead-free ultrahigh-conductive plastic is a conductive resin composite, which comprises a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal. This lead-free ultrahigh-conductive plastic includes those wherein lead-free solder parts that are finely dispersed in the above-mentioned thermoplastic resin are continuously connected to each other in the entire resin. The above-mentioned lead-free ultrahigh-conductive plastic includes those of which above-mentioned conductive resin composite has such a conductivity that the volume resistivity thereof is as low as $10^{-3}\Omega\cdot cm$ or under.

The synthetic resin to be used for this lead-free ultrahigh-conductive plastic is not specifically limited, and those that have been used conventionally can be used. However, from the viewpoints of ease in molding and some other physical properties required, it is preferable to use a thermoplastic resin.

The metal to be used for this lead-free ultrahigh-conductive plastic must be a lead-free metal that can half melt when the synthetic resin composite containing the metal is heat-plasticated. As the heat plastication temperature of thermoplastic resin is normally 350° C. or under, low-melting-point metals having a melting point below the above-mentioned plastication temperature are preferable. The metal may be a pure metal or an alloy. As the metal is kneaded under half-melted condition, its configuration is not limited particularly. However, a granular form or a powdery form of metal is preferable since it is easy to handle for dispersion.

Specific examples of the above-mentioned metal include zinc (Zn), tin (Sn), bismuth (Bi), aluminum (Al), cadmium (Cd), indium (In) and their alloys. Examples of preferred alloys among them include low-melting-point alloys such as Sn—Cu, Sn—Zn, Sn—Al and Sn—Ag.

Metals in powdery form for assisting dispersion of the solder include copper (Cu), nickel (Ni), aluminum (Al), chromium (Cr) and their alloys all in powdery form. The finer is the particle diameter of the metal powder, the finer is the dispersion of the solder after kneading. However, it is not necessary to provide powder of a common particle diameter. Powder of a metal having a distribution of particle diameters can be used. The usage of the metal components in the above-mentioned lead-free ultrahigh-conductive plastic is from 30 to 75% and preferably from 45 to 65% in volume ratio to the entire conductive resin composite.

The above-mentioned lead-free ultrahigh-conductive plastic uses a resin and a low-melting-point alloy (lead-free solder) which does not contain lead from the viewpoint of environment. As they are kneaded when the metal is kept in a half-melted state, the lead-free solder being metal components can be dispersed finely throughout the resin. Moreover, as kneading is made when the lead-free solder is kept under a half-melted condition, the dispersed solder fractions are kept connected continuously to each other. This connection is not just a contact but a junction between solder fractions. As the conductivity thus achieved differs from that obtained by contacts among metal fractions, even if the molding is heated to a high temperature, the junctions will not break, thus the molding stably exhibits low resistance.

When this material is to be formed by injection molding, as the metal components are partly half-melted and the lead-free solder is finely dispersed, the material can be formed by injection molding into fine configurations although the material contains a large amount of metal components. Hence binding members and the like can be formed by processes of injection molding alone. Moreover, as no plating is required, a conductive part of low resistance can be formed inside the injection molding.

To produce the above-mentioned conductive resin composite, kneading machines and extruding machines for conventional resins can be used.

Next, embodiments of the above-mentioned lead-free ultrahigh-conductive plastic will be described.

Embodiment 1

45% by volume of ABS resin (produced by Toray; Toyolac 441), 40% by volume of lead-free solder (produced by Fukuda Kinzoku Hakufun Kogyo; Sn—Cu—Ni—AtW-150) and 15% by volume of copper powder (produced by Fukuda Kinzoku Hakufun Kogyo; FCC-SP-77, mean particle diameter 10 μm) were lightly mixed together and fed into a kneader (Moriyama Seisakusho make, double-screw pressurized type) which was set at 220° C. The mixture was kneaded, without preheating time, at a rate ranging from 25 to 50 r.p.m. for 20 minutes; the resin was heat-plasticated and the solder, under half-melted condition, was dispersed throughout the resin.

The kneaded material was pelletized by a plunger extrusion pelletizer (Toshin make, Model TP60-2) at the dies temperature ranging from 200 to 240° C. to produce pellets. These pellets were used to make injection molding into molds by an injection molding machine (Kawaguchi Tekko make, KS-10B). The preset temperature was from 230 to 280° C., and the mold temperature was from the ordinary temperature to 150° C. The injection moldings obtained showed no sign of segregation of metal, and their surfaces were even.

Observation, under an optical microscope, of the state of dispersion of the solder of this injection molding showed that the solder was evenly dispersed throughout the resin and solder fractions were about 5 μm in size. The volume resistivity of this specimen was on the order of $10^{-5}\Omega\cdot cm$.

Embodiment 2

45% by volume of PBT resin (produced by Polyplastic), 40% by volume of lead-free solder (produced by Fukuda Kinzoku Hakufun Kogyo; Sn—Cu—Ni—AtW-150) and 15% by volume of copper powder (produced by Fukuda Kinzoku Hakufun Kogyo; FCC-SP-77, mean particle diameter 10 μm) were lightly mixed together and fed into the kneader (Moriyama Seisakusho make, double-screw pressurized type) which was set at 220° C. The mixture was kneaded, without preheating time, at a rate ranging from 25 to 50 r.p.m. for 20 minutes while efforts were made to prevent the temperature of the kneaded material from rising to 235° C. or over, by lowering the rate of revolution, cooling, etc.; the resin was heat-plasticated and the solder, under half-melted condition, was dispersed throughout the resin. Observation, under an optical microscope, of the state of dispersion of the solder of the kneaded material showed that the solder was evenly dispersed throughout the resin and solder fractions were about 5 μm in size.

Embodiment 3

35% by volume of ABS resin (produced by Toray; Toyolac 441), 55% by volume of lead-free solder (produced by Fukuda Kinzoku Hakufun Kogyo; Sn—Cu—Ni—AtW-150) and 10% by volume of copper powder (produced by Fukuda Kinzoku Hakufun Kogyo; FCC-SP-77, mean particle diameter 10 μm) were lightly mixed together, and the total of the metal components was set at 65% by volume. Then the mixture was fed into the kneader (Moriyama Seisakusho make, double-screw pressurized type) which was set at 220° C. The mixture was kneaded, without preheating time, at a rate ranging from 25 to 50 r.p.m. for 20 minutes; the resin was heat-plasticated and the solder, under half-melted condition, was dispersed throughout the resin.

The kneaded material was pelletized by the plunger extrusion pelletizer (Toshin make, Model TP60-2) at the dies temperature ranging from 200 to 240° C. to produce pellets. These pellets were used to make injection molding into molds by the injection molding machine (Kawaguchi Tekko make, KS-10B). The preset temperature of the machine was from 230 to 280° C., and the mold temperature was from the ordinary temperature to 150° C. The injection moldings obtained showed no sign of segregation of metal, and their surfaces were even. Observation, under an optical microscope, of the state of dispersion of the solder showed that the solder was evenly dispersed throughout the resin and solder fractions were about 100 μm or under in size. The volume resistivity of this specimen was on the order of $4\times10^{-5}\Omega\cdot cm$.

As clearly shown by the above-mentioned specific examples, the lead-free solder could be dispersed finely throughout the resins, and even when a large volume of metal components as high as 65% by volume were mixed, a kneaded material that did not show any segregation, under heating, of metals from the resin was obtained successfully. As the solder fractions were continuous to each other in this lead-free ultrahigh-conductive plastic, the conductivity of the plastic did not show any deterioration even when the temperature changed, thus the plastic stably exhibited high conductivity. In injection molding, the plastic was successfully molded into fine configurations without any clogging.

Figure 21:
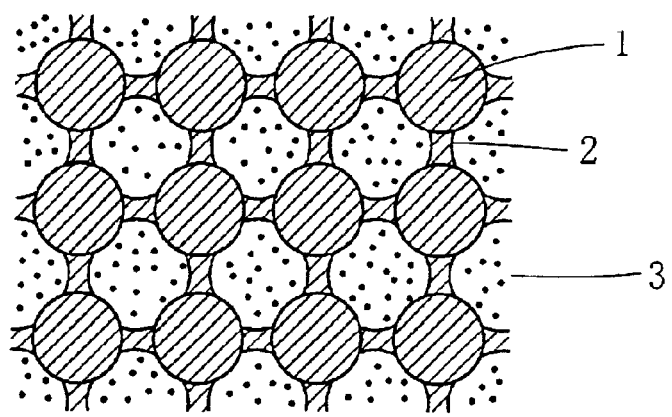
FIG. 21 is a schematic structural diagram of the lead-free ultrahigh-conductive plastic used in the embodiments.

With the use of this lead-free ultrahigh-conductive plastic, the binding members and the like having a three-dimensional configuration and low resistance can be formed by injection molding. In the following, with reference to the attached drawings, specific examples will be described in detail. FIG. 21 is a schematic structural diagram of the above-mentioned lead-free ultrahigh-conductive plastic. As shown in this diagram, in this lead-free ultrahigh-conductive plastic, the lead-free solders 1 are connected to each other by the solders 2 which are melted in the plastic 3. Hence the lead-free solders 1 are junctioned to each other and the conductivity is high and the reliability of the connection is high.

Figure 22:
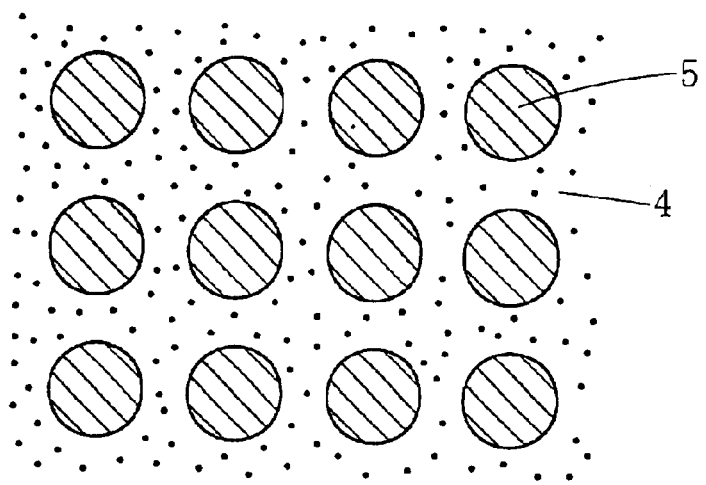
FIG. 22 is a schematic structural diagram of the conventional plastic wherein powder of a metal that does not melt is kneaded in a resin.

In contrast to this, as shown in FIG. 22, when powder 5 of a conventional metal that does not melt is kneaded in a plastic 4, the metal particles will not connect to each other unless a large amount of the metal content is mixed. Hence conductivity can not be obtained.

Thus the lead-free ultrahigh-conductive plastic shows a low resistance, does not exhibit deterioration in conductivity in a variety of environments, and has a high reliability.

To sum up, when a resin and a low-melting-point alloy (lead-free solder) which does not contain lead from the viewpoint of environment are used, and they are kneaded with the metal being kept in half-melted condition, the lead-free solder being the metal components can be dispersed finely throughout the resin. Moreover, as kneading is made when the lead-free solder is kept in half-melted condition, the dispersed solder fractions are kept connected continuously to each other. This connection is not just a contact but a junction between solder fractions. As the conductivity thus achieved differs from that obtained by contacts among metal fractions, even if the molding is heated to a high temperature, the junctions will not break, thus the molding stably exhibits low resistance.

Figure 2:
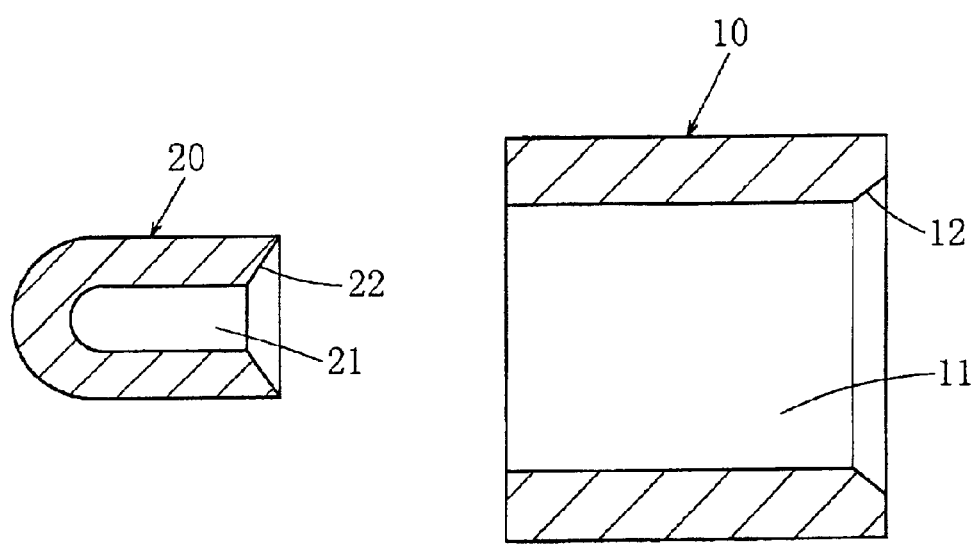
FIG. 2 is a sectional view of the binding members of the first embodiment.
Figure 3:
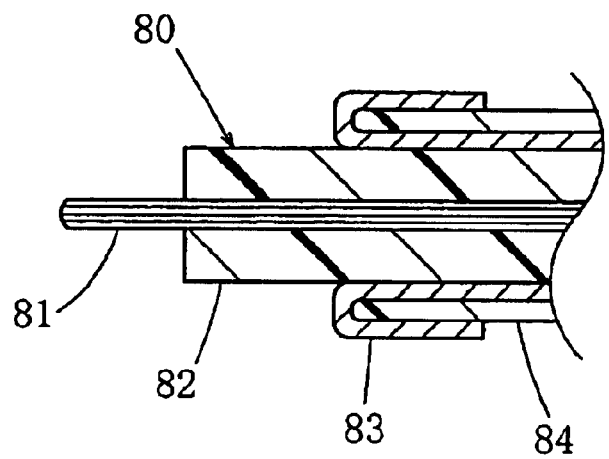
FIG. 3 is a sectional view of the coaxial cable used in the first embodiment. The coverings of the coaxial cable are removed.

When this material is to be formed by injection molding, as the metal components are partly half-melted and the lead-free solder is finely dispersed, the material can be formed by injection molding into fine configurations although the material contains a large amount of metal components. Hence the binding members and the like can be formed by Next, embodiments of the present invention will be described. The first embodiment is a binding member for coaxial cable using the resin solder. As shown in FIG. 3, the coaxial cable 80 comprises a centered conductor 81, an insulating covering 82 which covers the centered conductor 81, an outer conductor 83 which is braided strands and covers the outside of the insulating covering 82, and an insulating covering 84 which covers the outer conductor 83. As shown in FIG. 1 and FIG. 2, the binding members include a binding member 10 for the outer conductor 83 and a binding member 20 for the centered conductor 81. The binding member 10 for the outer conductor 83 is formed into a tubular piece which covers the outer conductor 83 being exposed from the insulating covering 84. The configuration of the binding member 10 is not limited provided that it is tubular. Here it is a cylinder with a through hole 11. A chamfered part 12 is provided, if necessary, in one opening of the through hole 11. This chamfered part 12 guides the end of the coaxial cable 80 into the through hole 11. The binding member 20 for the centered conductor 81 is formed into a tubular piece which covers the centered conductor 81 being exposed from the insulating covering 82. The configuration of the binding member 20 is not limited provided that it is tubular. Here, it is formed into a cylinder with a blind hole or bottomed hole 21 which is open only at one end. It may have a through hole in place of the bottomed hole 21. The opening of the bottomed hole 21 is provided with a chamfered part 22, if necessary. The chamfered part 22 guides the end of the centered conductor 81 into the bottomed hole 21. These binding members 10, 20 are made of the lead-free ultrahigh-conductive plastic being the conductive resin composite.

Figure 4:
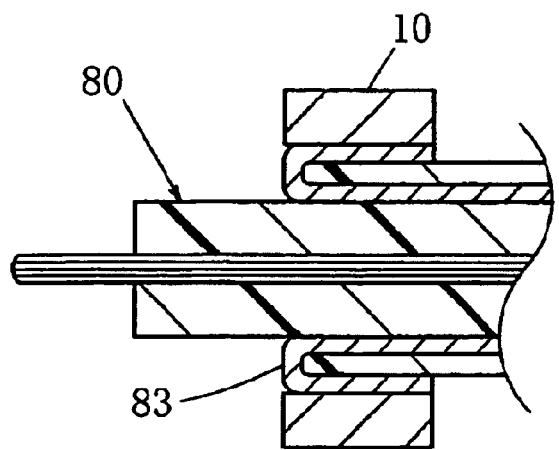
FIG. 4 is a sectional view showing the binding member of the first embodiment covering the outer conductor of the coaxial cable of FIG. 3.
Figure 5:
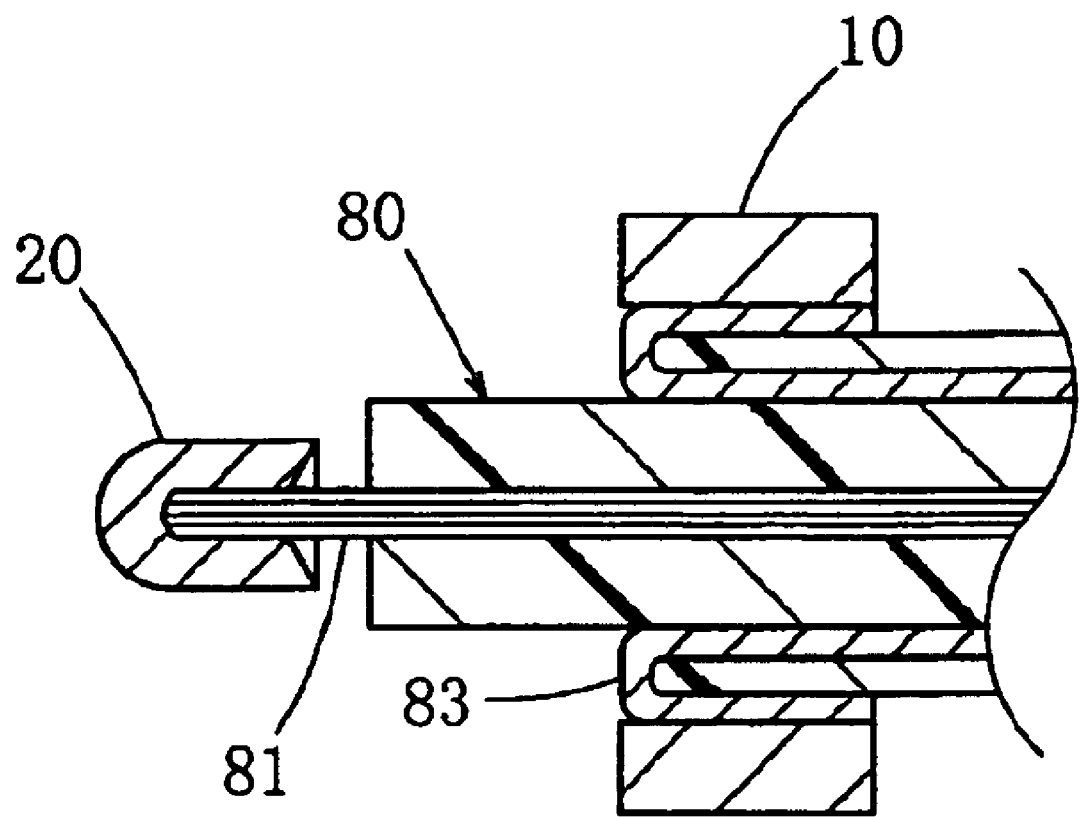
FIG. 5 is a sectional view showing the binding members of the first embodiment covering both the outer conductor and the centered conductor of the coaxial cable of FIG. 3.

The method of use of these binding members 10, 20 will be described. As shown in FIG. 3, an end of the insulating covering 84 is removed to expose the outer conductor 83, and the exposed outer conductor 83 is reversed to cover the new end of the insulating covering 84. In this case, the exposed outer conductor 83 may be left as it is. The end of the insulating covering 82 is removed to expose the end of the centered conductor 81. As shown in FIG. 4, the binding member 10 is fitted to cover the outer conductor 83 which is exposed from the insulating covering 84. When the contacting parts of both the binding member 10 and the conductor 83 are heated, the lead-free solder being contained in the lead-free ultrahigh-conductive plastic of the binding member 10 will melt out to stick to the outer conductor 83. When the solder cools and solidifies, the binding member 10 will be connected to the outer connector 83. As shown in FIG. 5, the binding member 20 is fitted to cover the centered conductor 81 which is exposed from the insulating covering 82. When the contacting parts of both the binding member 20 and the conductor 81 are heated, the lead-free solder being contained in the lead-free ultrahigh-conductive plastic of the binding member 20 will melt out to stick to the centered conductor 81. When the solder cools and solidifies, the binding member 20 will be connected to the centered conductor 81. The above-mentioned heating is effected by, for example, blowing hot air or irradiating high frequency waves or laser beams to give thermal energy.

Figure 7:
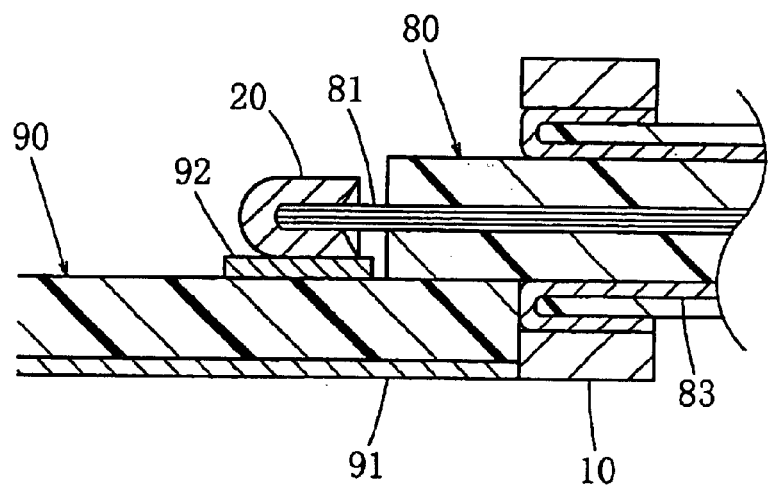
FIG. 7 is a sectional view showing the binding members of the first embodiment, which are connected to a printed circuit board.

When the binding members 10, 20 being connected to the coaxial cable 80 are placed on electric connecting devices or a printed circuit board and the contacting parts between them are heated, the lead-free solder of the lead-free ultrahigh-conductive plastic of the binding members 10, 20 will melt out and stick to the electric connecting devices or the printed circuit board. When the solder cools and solidifies, the binding members 10, 20 will be connected to the electric connecting devices or the printed circuit board. This in turn will connect the coaxial cable 80 to the electric connecting devices or the printed circuit board. The above-mentioned heating is effected by, for example, blowing hot air or irradiating high frequency waves or laser beams to give thermal energy. FIG. 7 shows an example of use wherein the binding members 10, 20 are connected to a printed circuit board 90. The binding member 10 for the outer conductor 83 is connected to the grounding conductor 91 of the printed circuit board 90, and the binding member 20 for the centered conductor 81 is connected to the signal conductor 92 of the printed circuit board 90. Examples of use wherein the binding members 10, 20 are connected to electric connecting devices such as terminals, electric contacts, etc. will be described later.

If the binding members of the first embodiment are used, when the axial cable 80 is to be connected to electric connecting devices or the printed circuit board 90, no work of separately applying solder will be required. Hence, even if an adequate space for the soldering work can not be provided, the coaxial cable 80 can be easily connected to the electric connecting devices or the printed circuit board 90. Moreover, as solder quality control, temperature control and the like are not required, the control man-hour is reduced correspondingly. Furthermore, as the binding member 10 or 20 circumferentially covers the outer conductor 83 or the centered conductor 81 to prevent the outer conductor 83 or the centered conductor 81 from being disturbed, the outer conductor 83 or the centered conductor 81 can be easily connected to the electric connecting device or the printed circuit board 90 and the workability is good. As the binding members 10, 20 have conductivity, the shielding performance of the signal line is ensured. Further, the connection of a very fine wire can be done by an automatic machine, and the productivity is enhanced and the cost is reduced. The lead-free ultrahigh-conductive plastic exhibits high conductivity, as high as $10^{-3} \Omega \cdot cm$ or under in volume resistivity. Hence the electric resistance of the binding members 10, 20 can be reduced. After the connection of the coaxial cable 80, when electricity is passed at a normal level, the lead-free ultrahigh-conductive plastic will not melt due to heat generation. Moreover, in comparison with the technology of MID wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This in turn allows passage of a larger current. As the lead-free ultrahigh-conductive plastic can be formed by injection molding, the binding members 10, 20 can be directly formed by injection molding. As it has a greater freedom of molding, the binding members 10, 20 can be molded to a variety of configurations according to their applications. This makes it easier to obtain impedance matching.

Figure 6:
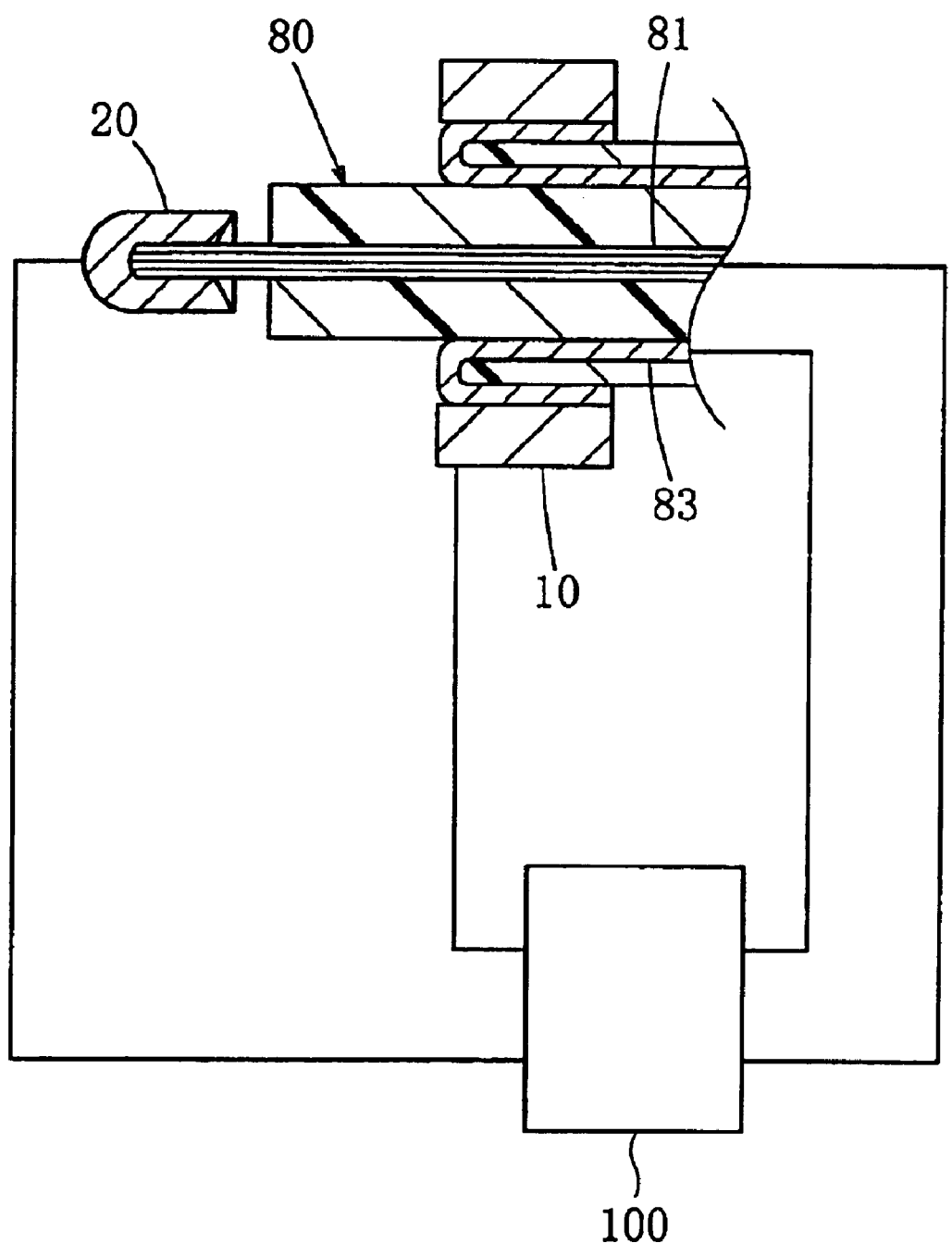
FIG. 6 is a schematic diagram showing another embodiment of the method of connecting the binding members of the first embodiment to the coaxial cable.

Another embodiment of the method of connecting the binding members 10, 20 to the coaxial cable 80 will be described. As shown in FIG. 6, first the binding member 10 is placed to cover the outer conductor 83 being exposed from the insulating covering 84. Next, electricity is passed between the binding member 10 and the outer conductor 83 by a power source 100 to melt the lead-free solder which is contained in the binding member 10 to connect the binding member 10 to the outer conductor 83, In a similar manner, the binding member 20 is placed to cover the centered conductor 81 being exposed from the insulating covering 82. Next, electricity is passed between the binding member 20 and the centered conductor 81 by the power source 100 to melt the lead-free solder being contained in the binding member 20 to connect the binding member 20 to the centered conductor 81.

When this method is used, as the binding members 10, 20 generate heat by themselves, even if it is difficult to externally heat the contacting parts of both the binding members 10, 20 and the conductors 83, 81 of the coaxial cable 80, the binding members 10, 20 can be connected to the conductors 83, 81 of the coaxial cable 80.

Figure 8:
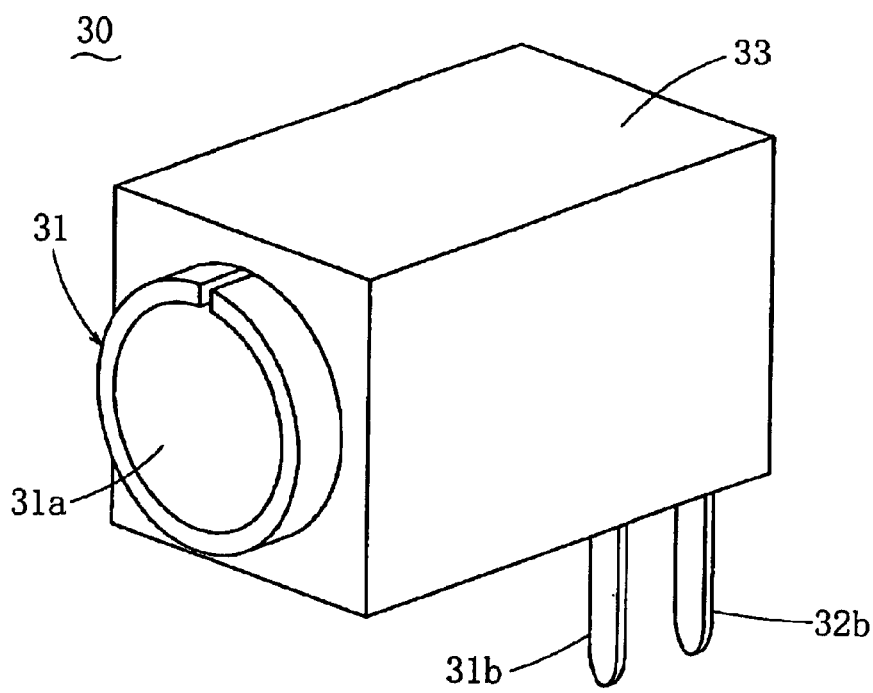
FIG. 8 is a perspective view of the electric connector of the second embodiment.
Figure 9:
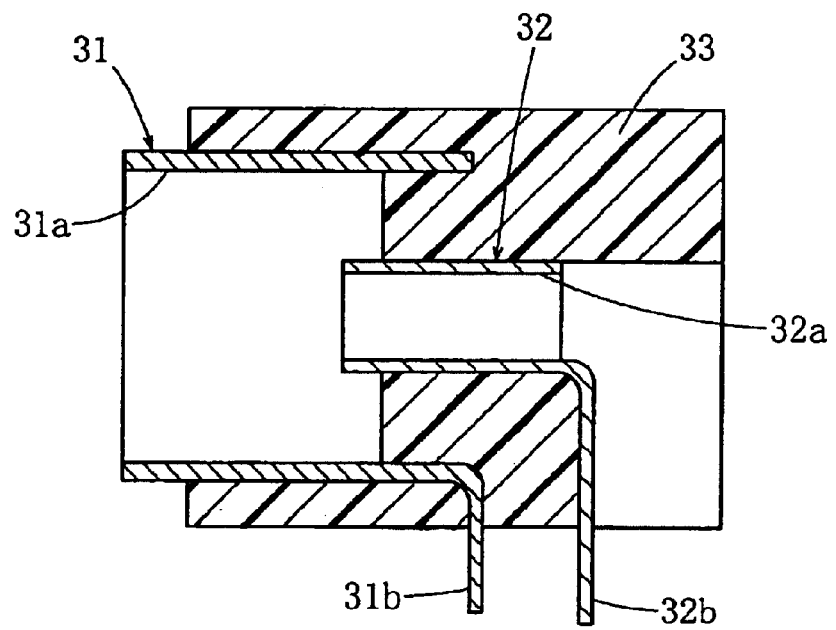
FIG. 9 is a sectional view of the electric connector of the second embodiment.
Figure 10:
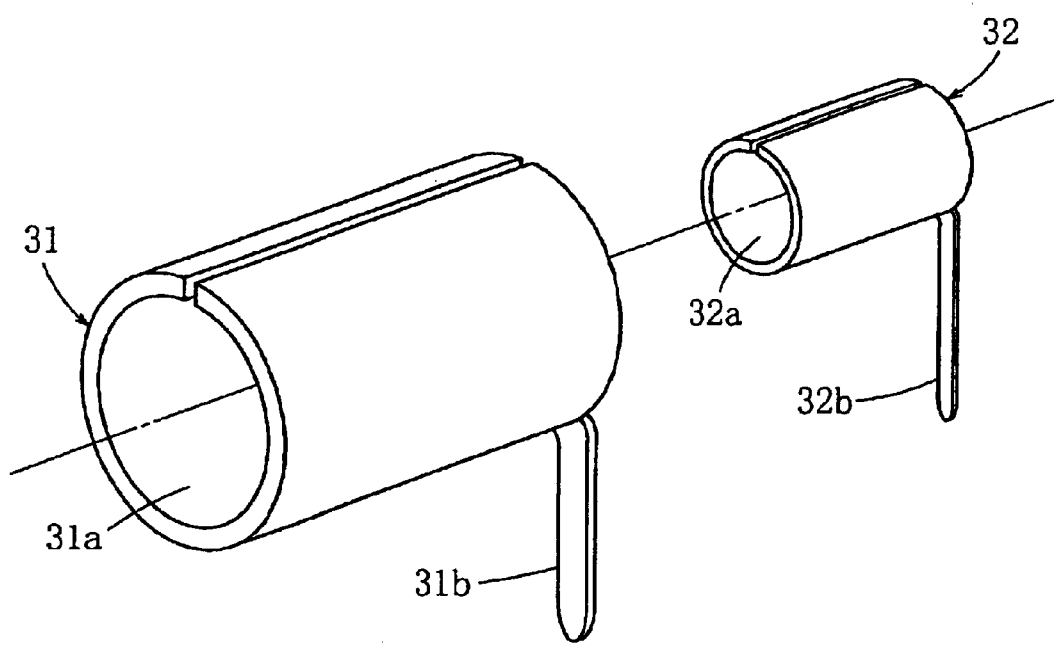
FIG. 10 is a perspective view of the electric contacts of the electric connector of the second embodiment.

FIG. 8 through FIG. 10 show an electric connector for coaxial cable being the second embodiment of the present invention. This electric connector 30 is mounted on a printed circuit board. This electric connector 30 comprises a first electric contact 31, a second electric contact 32 and a housing 33 which insulates and couples these electric contacts 31, 32. The first electric contact 31 is made of a conductor such as a copper alloy and has a receiving port 31a into which the binding member 10 for the outer conductor 83 is inserted. The configuration of the receiving port 31a is not limited provided that the binding member 10 can be inserted into the port 31a. Here the first electric contact 31 is formed into a tubular piece and the opening in one end thereof is used as the receiving port 31a. A lead 31b for connecting to another member is provided at the other end of the first electric contact 31. The second electric contact 32 is made of a conductor such as a copper alloy and has a receiving port 32a into which the binding member 20 for the centered conductor 81 is inserted. The configuration of the receiving port 32a is not limited provided that the binding member 20 can be inserted into the receiving port 32a. Here the second electric contact 32 is formed into a tubular piece and the opening in one end thereof is used as the receiving port 32a. A lead 32b for connecting to another member is provided at the other end of the second electric contact 32. The housing 33 is made of an insulator, and the first and second electric contacts 31, 32 are fitted into the housing 33 or the first and second electric contacts 31, 32 and the housing 33 are formed integrally. The respective leads 31b, 32b are led out of the housing 33.

Figure 11:
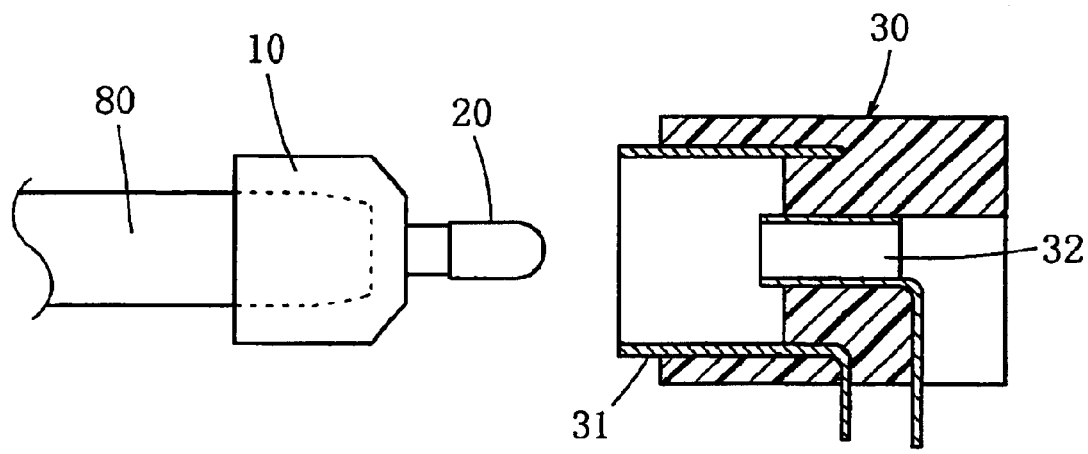
FIG. 11 is a sectional view showing the electric connector of the second embodiment before the connection of the coaxial cable to which the binding members are connected or which is covered by the binding members.
Figure 12:
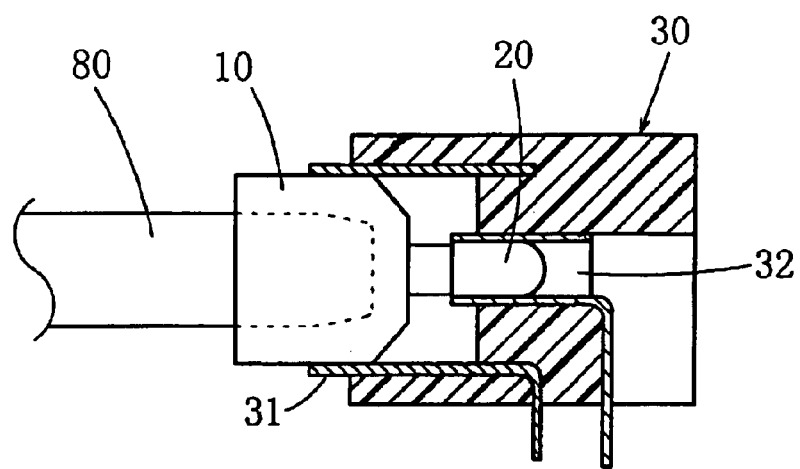
FIG. 12 is a sectional view showing the electric connector of the second embodiment after the connection of the coaxial cable to which the binding members are connected or which is covered by the binding members.

The method of use of this electric connector 30 will be described. As shown in FIG. 11 and FIG. 12, the binding member 10, which connects with or covers the outer conductor 83 of the coaxial cable 80, is inserted into the receiving port 31a of the first electric contact 31 of the electric connector 30, and the binding member 20, which connects with or covers the centered conductor 81 of the coaxial cable 80, is inserted into the receiving port 32a of the second electric contact 32. When the contacting parts of the first and second electric contacts 31, 32 and the binding members 10, 20 are heated, the lead-free solder being contained in the lead-free ultrahigh-conductive plastic of the binding members 10, 20 will melt out and stick to the first and second electric contacts 31, 32. When the solder cools and solidifies, the binding members 10, 20 will be connected to the first and second electric contacts 31, 32, and this will connect the coaxial cable 80 to the electric connector 30. Here, the expression "the binding member connects with or covers the conductor" is used because, in the stage of inserting the binding member into the receiving port of the electric contact, the binding member may be either in the state of being connected to the conductor by heating and cooling or in the state of just covering the conductor. The above-mentioned heating is made by, for example, blowing hot air or irradiating high frequency waves or laser beams to give thermal energy.

In the case of this second embodiment, when the coaxial cable 80 is to be connected to the electric connector 30, the work of separately applying solder is not required. Accordingly, even if an adequate space for the soldering work can not be provided, the coaxial cable 80 can be easily connected to the electric connector 30. Moreover, as solder quality control, temperature control and the like are not required, the control man-hour is reduced correspondingly. Furthermore, as the binding member 10 or 20 circumferentially covers the outer conductor 83 or the centered conductor 81 to prevent the outer conductor 83 or the centered conductor 81 from being disturbed, the outer conductor 83 or the centered conductor 81 can be easily connected to the electric connector 30. Thus the workability is good, and as the binding members 10, 20 have conductivity, the shielding performance of the signal line is ensured. Further, connection of a very fine wire can be done by an automatic machine, and the productivity is enhanced and the cost is reduced. The lead-free ultrahigh-conductive plastic exhibits high conductivity, as high as $10^{-3} \Omega \cdot cm$ or under in volume resistivity. Hence the electric resistance of the wiring harness comprising the coaxial cable 80 and the electric connector 30 can be reduced. After the connection of the coaxial cable 80, when electricity is passed at a normal level, the lead-free ultrahigh-conductive plastic will not melt due to heat generation. Moreover, in comparison with the technology of MID wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This in turn allows passage of a larger current in the wiring harness.

The electric contact may be made of a conductor. The present invention includes embodiments wherein the electric contact is made of, for example, the lead-free ultrahigh-conductive plastic. Among such embodiments, like the second embodiment, when the electric contact 31, 32 is made of a material of which strength and elasticity are higher than those of the lead-free ultrahigh-conductive plastic, for example a metal, the strength and elasticity of the electric contact 31, 32 will be secured, and the durability against repeated insertion and extraction will be improved.

Figure 13:
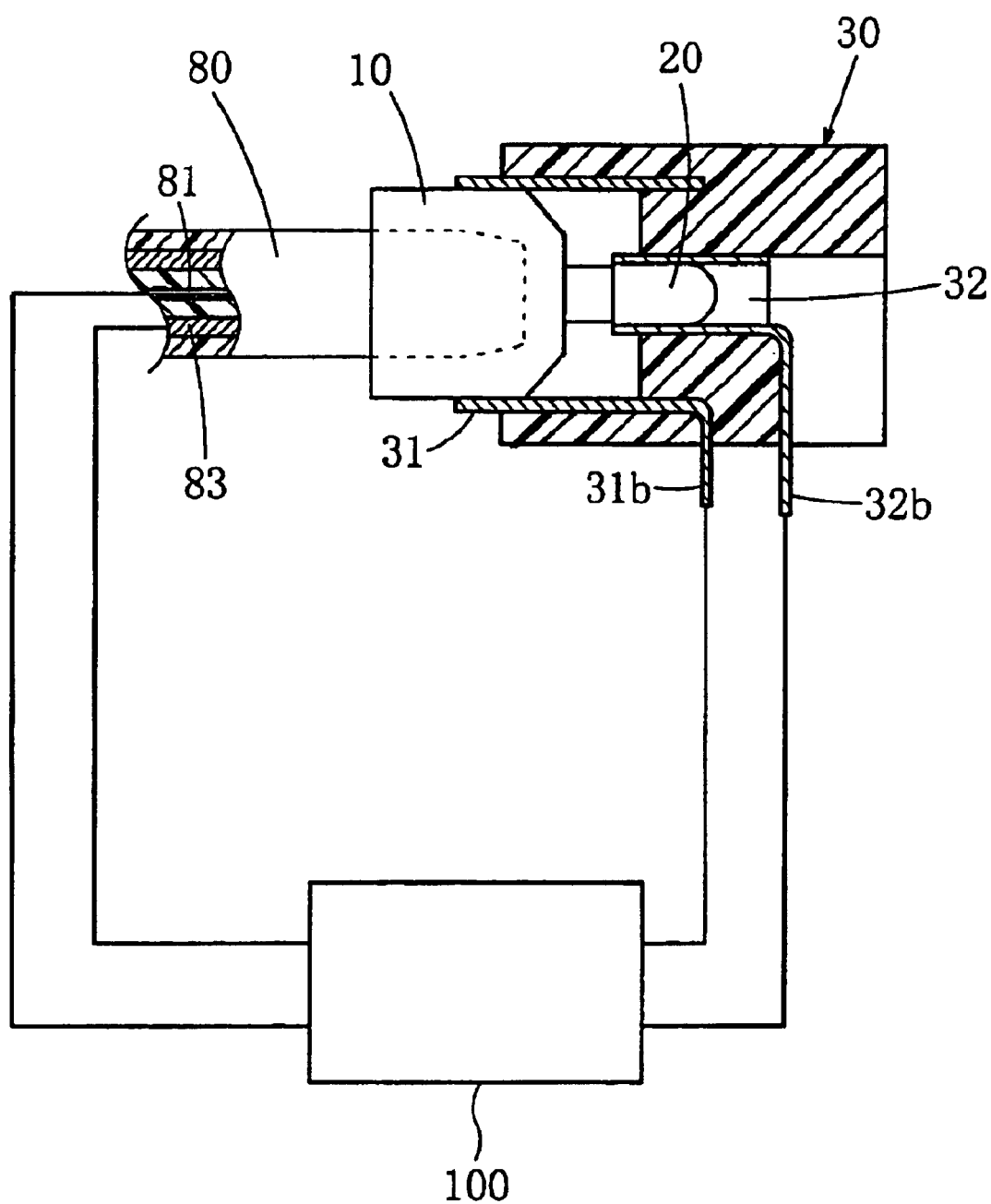
FIG. 13 is a schematic diagram showing another embodiment of the method of connecting the binding members to the electric connector of the second embodiment.

Another embodiment of the method of connecting these binding members 10, 20 to the electric connector 30 will be described. As shown in FIG. 13, first the binding member 10, which connects with or covers the outer conductor 83, is inserted into the first electric contact 31. Next, electricity is passed between the first electric contact 31 and the outer conductor 83 by a power source 100 to melt the lead-free solder being contained in the binding member 10 to connect the binding member 10 to the first electric contact 31. In a similar manner, the binding member 20, which connects with or covers the centered conductor 81, is inserted into the second electric contact 32. Next, electricity is passed between the second electric contact 32 and the centered conductor 81 by the power source 100 to melt the lead-free solder being contained in the binding member 20 to connect the binding member 20 to the second electric contact 32. In this process, if the binding member 10 is just covering the outer conductor 83 or the binding member 20 is just covering the centered conductor 81, the binding member 10 and the outer conductor 83 or the binding member 20 and the centered conductor 81 will be connected to each other by the above mentioned passage of electricity.

When this method is used, as the binding members 10, 20 generate heat by themselves, even if it is difficult to externally heat the contacting parts of both the binding members 10, 20 and the electric contacts 31, 32, the binding members 10, 20 can be connected to the electric contacts 31, 32.

Figure 14:
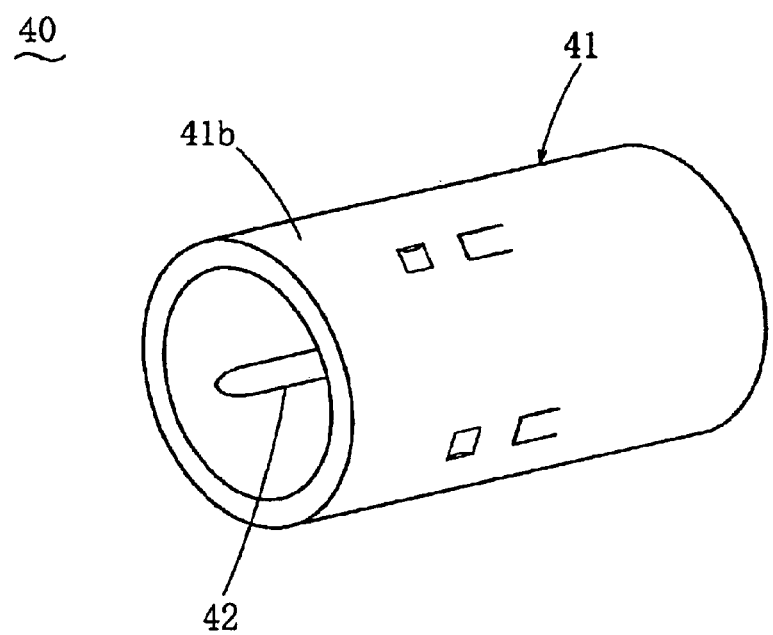
FIG. 14 is perspective view of the electric connector of the third embodiment.
Figure 15:
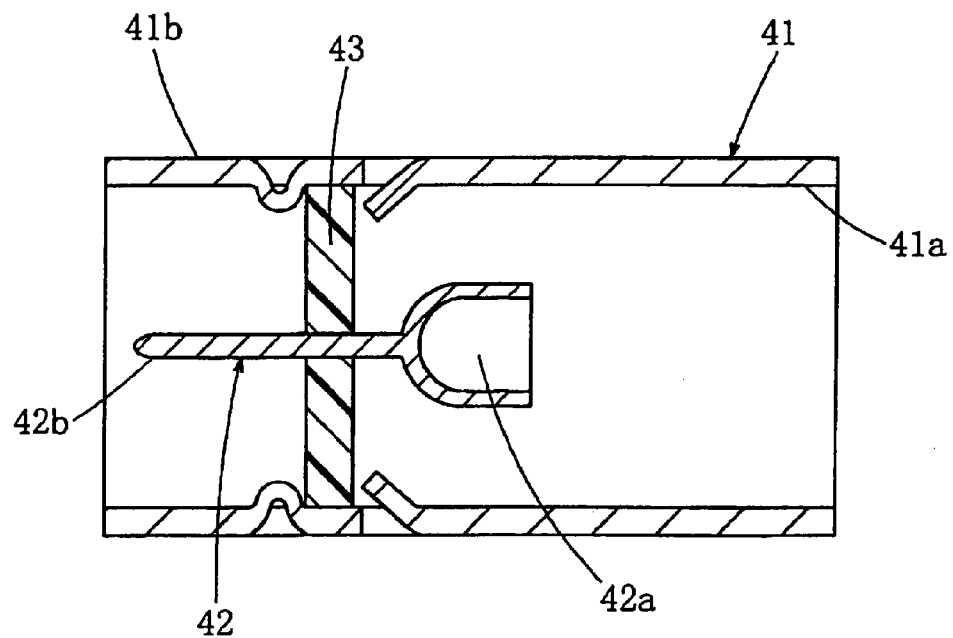
FIG. 15 is a sectional view of the electric connector of the third embodiment.

FIG. 14 and FIG. 15 show the third embodiment being an electric connector for coaxial cable. This electric connector 40 is connected to a counterpart connector 50, which will be described later. The electric connector 40 comprises a first electric contact 41, a second electric contact 42 and a housing 43, which insulates and couples these electric contacts 41, 42. The first electric contact 41 is made of a conductor, for example, a copper alloy, and has a receiving port 41a into which the binding member 10 for the outer conductor 83 is inserted. The configuration of the receiving port 41a is not limited provided that the binding member 10 can be inserted into the receiving port 41a. Here, the first electric contact 41 is formed into a tubular piece and the opening at one end thereof is used as the receiving port 41a. The other end thereof is used as the contacting part 41b to be connected to the counterpart connector 50. A plate-shaped housing 43, which is formed of an insulator, is provided inside the first electric contact 41. The second electric contact 42 is made of a conductor, for example, a copper alloy, and is made to pierce the housing 43. The second electric contact 42 is fixed onto the housing 43. The second electric contact 42 has, at one end thereof, a receiving port 42a into which the binding member 20 for the centered conductor 81 is inserted. The configuration of the receiving port 42a is not limited provided that the binding member 20 can be inserted into the receiving port 42a. Here, the second electric contact is formed into a rod, and one end thereof is formed into a cup which is used as the receiving port 42a. The other end of the second electric contact 42 is used as the contacting part 42b for connecting with the counterpart connector 50.

Figure 16:
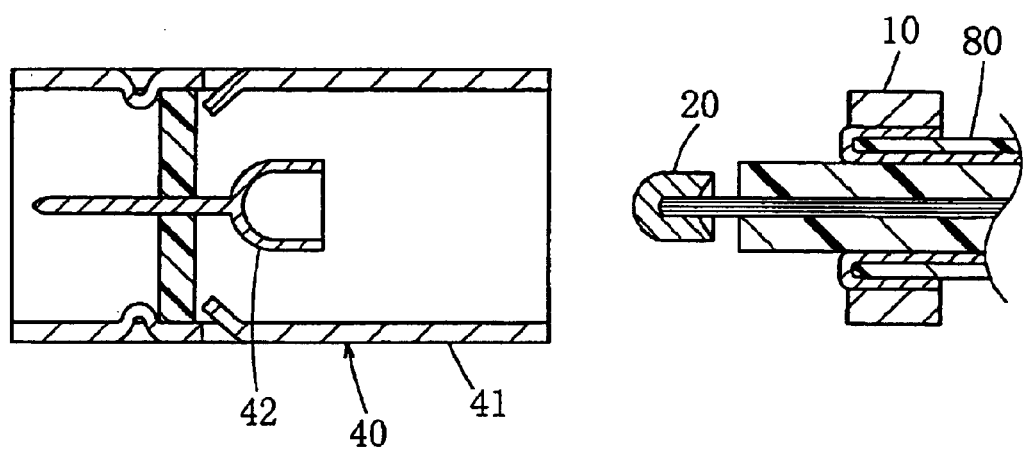
FIG. 16 is a sectional view of the electric connector of the third embodiment before the connection of the coaxial cable to which the binding members are connected or which is covered by the binding members.
Figure 17:
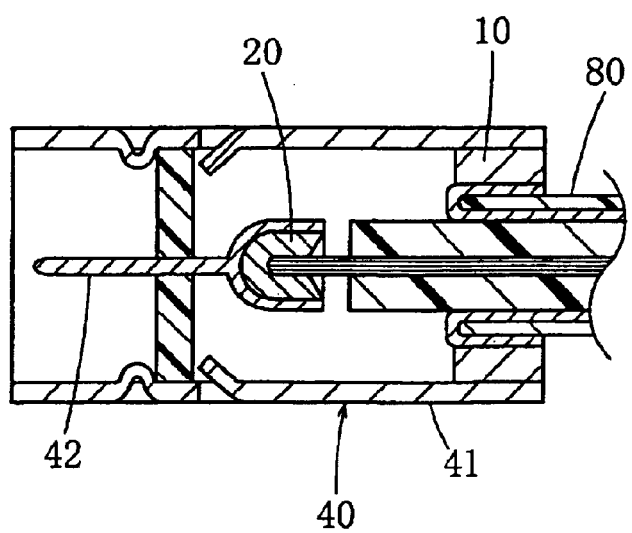
FIG. 17 is a sectional view of the electric connector of the third embodiment after the connection of the coaxial cable to which the binding members are connected or which is covered by the binding members.

The method of use of this electric connector 40 will be described. As shown in FIG. 16 and FIG. 17, the binding member 10, which connects with or covers the outer conductor 83 of the coaxial cable 80, is inserted into the receiving port 41a of the first electric contact 41 of the electric connector 40, and the binding member 20, which connects with or covers the centered conductor 81 of the coaxial cable 80 is inserted into the receiving port 42a of the second electric contact 42. When the contacting parts of the first and second electric contacts 41, 42 and the binding parts 10, 20 are heated, the lead-free solder being contained in the lead-free ultrahigh-conductive plastic of the binding members 10, 20 will melt out to stick to the first and second electric contacts 41, 42. When the solder cools and solidifies, the binding members 10, 20 will be connected to the first and second electric contacts 41, 42, and this in turn will connect the coaxial cable 80 to the electric connector 40. The above-mentioned heating is made by, for example, blowing hot air or irradiating high frequency waves or laser beams to give thermal energy.

Figure 18:
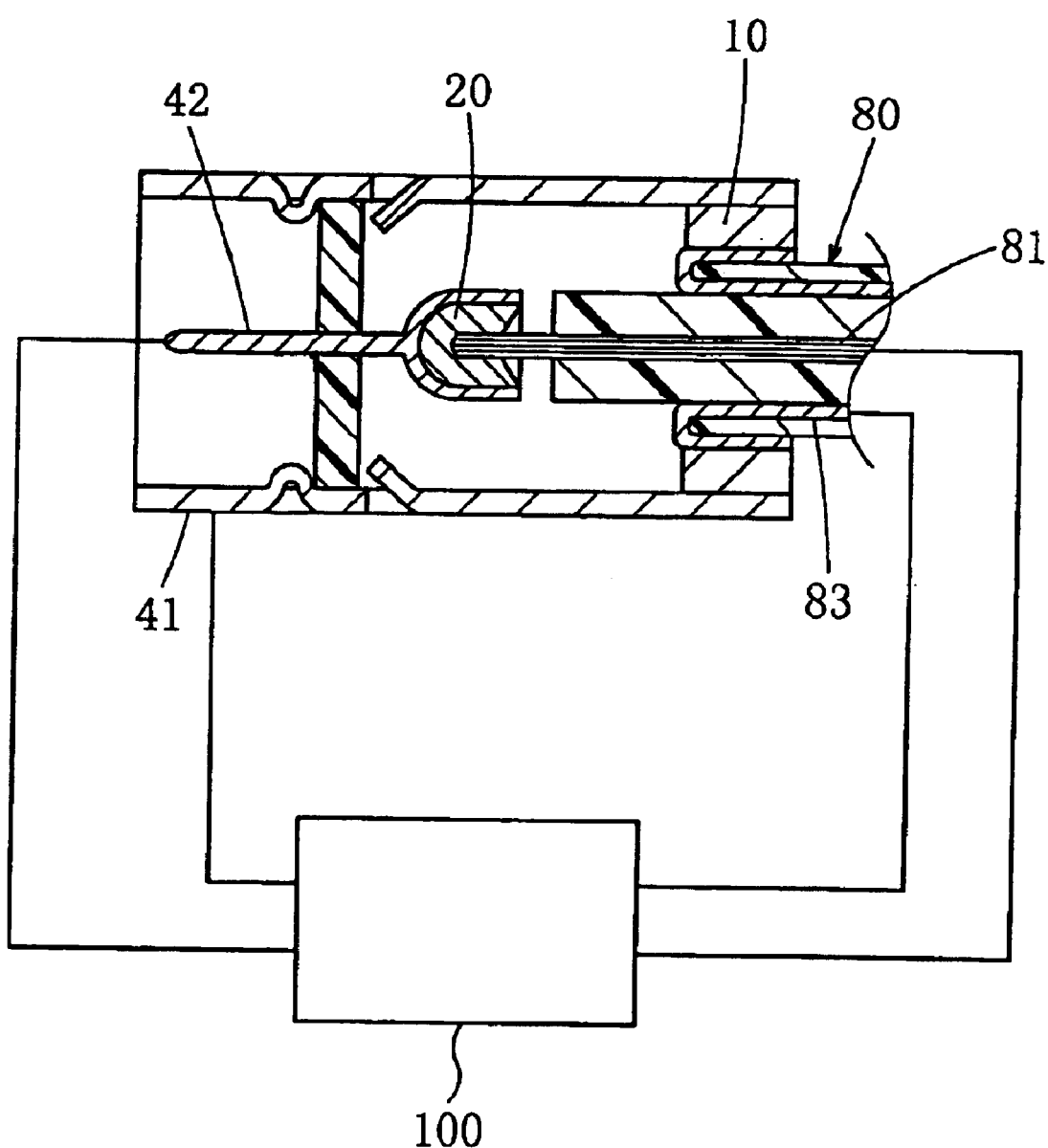
FIG. 18 is a schematic diagram showing another embodiment of the method of connecting the binding members to the electric connector of the third embodiment.

FIG. 18 shows another embodiment of the method of connecting the binding members 10, 20 to the electric connector 40 of the third embodiment. This method is similar to the method of connecting the binding members 10, 20 to the electric connector 30 of the second embodiment, and can be similarly described by substituting the first electric contact 31 with the first electric contact 41, and the second electric contact 32 with the second electric contact 42. Functions and effects similar to those of the second embodiment can be obtained.

Figure 19:
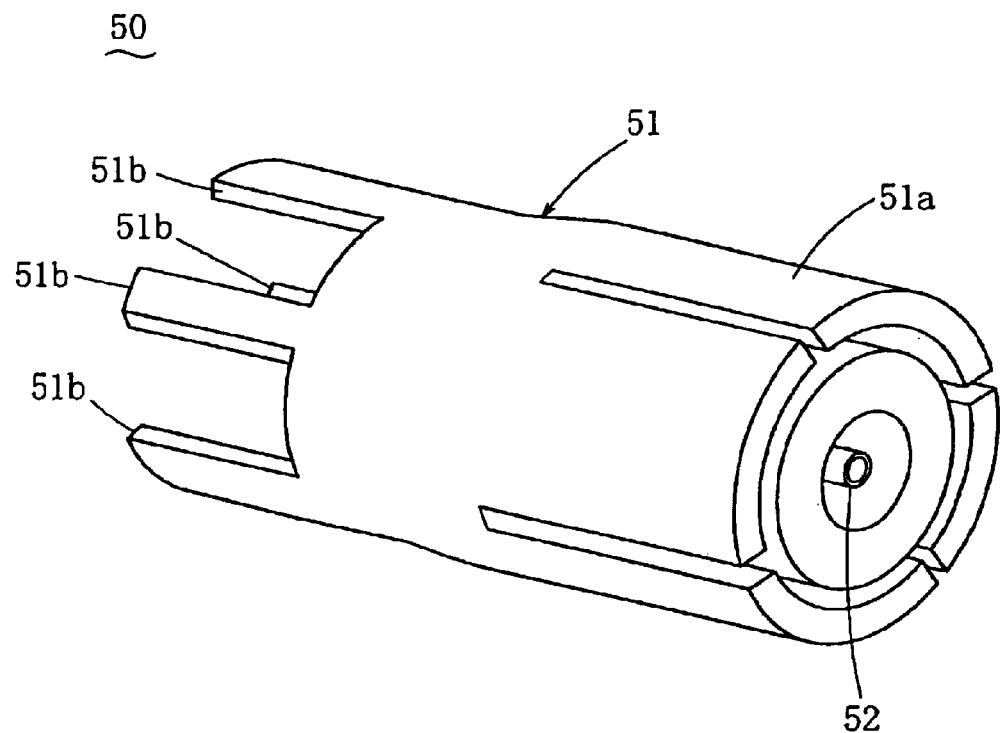
FIG. 19 is a perspective view of the counterpart connector which is connected to the electric connector of the third embodiment.
Figure 20:
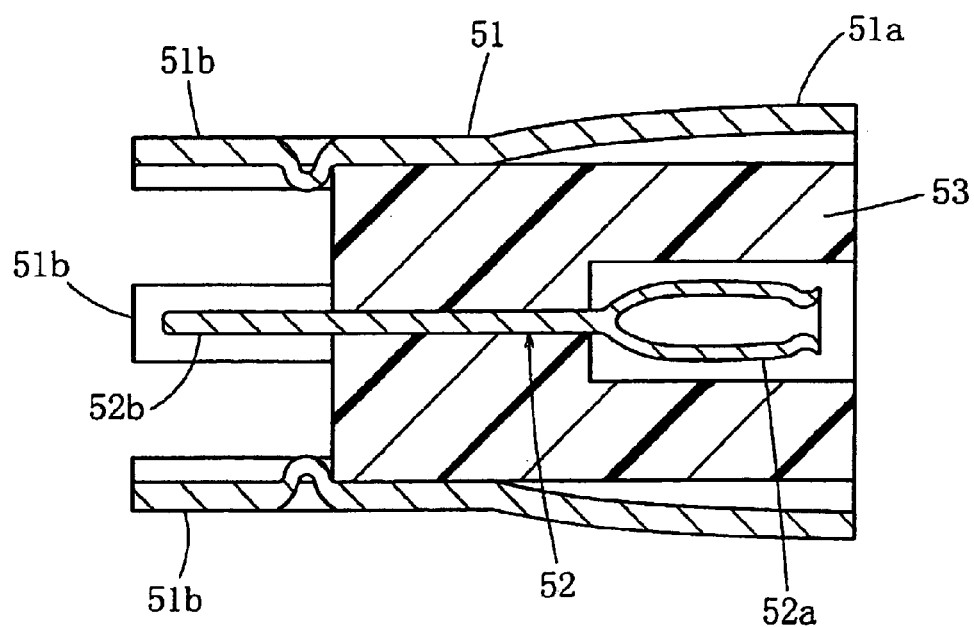
FIG. 20 is a sectional view of the counterpart connector which is connected to the electric connector of the third embodiment.

FIG. 19 and FIG. 20 show the counterpart connector 50 to which the electric connector 40 of the third embodiment is connected. This counterpart connector 50 is mounted on a printed circuit board. The counterpart connector 50 comprises a first electric contact 51, a second electric contact 52 and a housing 53 which insulates and couples these electric contacts 51, 52. The first electric contact 51 is made of a conductor, for example, a copper alloy and has a contacting part 51a into which the first electric contact 41 of the above-mentioned electric connector 40 is inserted. The configuration of the contacting part 51a is not limited provided that the first electric contact 41 can be inserted into the part 51a. Here, the first electric contact 51 is formed into a tubular piece and the opening in one end thereof is used as the contacting part 51a. Leads 51b for mounting on the printed circuit board are formed to protrude from the other end thereof. The housing 53 being formed of an insulator is provided inside the first electric contact 51. A gap to receive the first electric contact 41 is open between the first electric contact 51 and the housing 53. Slits are made in the first electric contact 51 from the side of the contacting part 51a in the axial direction. Each portion between a slit and an adjacent slit functions as a leaf spring. Thus these portions press the first electric contact 41 against the housing 53 to secure a fitting force between the first electric contact 41 and the first electric contact 51. The second electric contact 52 is made of a conductor, for example, a copper alloy, and is made to pierce the housing 53. The second electric contact 52 is fixed to the housing 53. The second electric contact 52 has, at one end thereof, a contacting part 52 which fits with the second electric contact 42 of the above-mentioned electric connector 40. The configuration of the contacting part 52a is not limited provided that the second electric contact 42 can be inserted into the contacting part 52a. Here, the second electric contact 52 is formed into a rod, and one end thereof is formed into a cup which is used as the contacting part 52a. The other end of the second electric contact 52 is used as the lead 52b for mounting on the printed circuit board.

The functions and effects obtained from the third embodiment are similar to those described in relation to the second embodiment.

The present invention includes embodiments wherein features of the above-mentioned embodiments are combined. The present invention is also applicable to coaxial cables which have a plurality of centered cables and their insulating coverings. Such a coaxial cable 80 comprises a plurality of centered conductors 81, a plurality of insulating coverings which cover the respective centered conductors 81, an outer conductor 83 which consists of braided strands and covers the outside of the above-mentioned plurality of insulating coverings 82, and an insulating covering 84 which covers the outer conductor 83. When the binding members of the first embodiment are to be used for this coaxial cable 80, one binding member 10 is used for the outer conductor 83, and a plurality of binding members 10 are used for the centered conductors 81. When the electric connector 30 of the second embodiment or the electric connector 40 of the third embodiment is used for this coaxial cable 80, a plurality of the second electric connectors 32 or 42 are used. Coaxial cables of such a kind are exemplified by Twinax.

With the description of these embodiments, the binding member for coaxial cable using resin solder, which was described in the summary of the invention, has been fully disclosed. Moreover, with the description of these embodiments, the electric connector for coaxial cable, the method of connecting the binding member to coaxial cable, and the method of connecting the binding member to the electric connector, which will be described below, have been fully explained.

The electric connector for coaxial cable comprises a first electric contact, which is made of a conductor and has a receiving port into which the above-mentioned binding member for the outer conductor is inserted, a second electric contact, which is made of a conductor and has a receiving port into which the above-mentioned binding member for the centered conductor is inserted, and a housing, which insulates and couples these electric contacts.

The binding member of the present invention, which connects to or covers the outer conductor of the coaxial cable, is inserted into the receiving port of the first electric contact of this electric connector, and the binding member of the present invention, which connects to or covers the centered conductor of the coaxial cable, is inserted into the receiving port of the second electric contact. When the contacting parts of the electric contacts and the binding members are heated, the lead-free solder being contained in the lead-free ultrahigh-conductive plastic of the binding members will melt out to stick to the electric contacts. When the solder cools and solidifies, the binding members will be connected to the electric contacts, and this will connect the coaxial cable to the electric connector.

In this case, when the coaxial cable is to be connected to the electric connector, the work of separately applying solder is not required. Accordingly, even if an adequate space for the soldering work can not be provided, the coaxial cable can be easily connected to the electric connector. Moreover, as solder quality control, temperature control and the like are not required, the control man-hour is reduced correspondingly. Furthermore, as the binding member circumferentially covers the outer conductor or the centered conductor to prevent the outer conductor or the centered conductor from being disturbed, the outer conductor or the centered conductor can be easily connected to the electric connector. Thus the workability is good, and as the binding members have conductivity, the shielding performance of the signal line is ensured. Further, connection of a very fine wire can be done by an automatic machine, and the productivity is enhanced and the cost is reduced. The lead-free ultrahigh-conductive plastic exhibits high conductivity, as high as $10^{-3}\Omega\cdot cm$ or under in volume resistivity. Hence the electric resistance of the wiring harness comprising the coaxial cable and the electric connector can be reduced. After the connection of the coaxial cable, when electricity is passed at a normal level, the lead-free ultrahigh-conductive plastic will not melt due to heat generation. Moreover, in comparison with the technology of MID wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. Thus a larger current can be passed in the wiring harness. When the electric connector is made of a material of which strength and elasticity are higher than those of the lead-free ultrahigh-conductive plastic, for example, a metal, the strength and elasticity of the electric connector will be secured. Accordingly, this electric connector for coaxial cable is suitable as the electric connector for connecting the coaxial cable via the above-mentioned binding member.

The method of connecting the binding member to the coaxial cable is to place the binding member to cover the outer conductor or the centered conductor which is exposed from the insulating covering, pass electricity between the binding member and the outer conductor or the centered conductor of the coaxial cable to melt the lead-free solder being contained in the binding member and connect the binding member to the outer conductor or the centered conductor.

When this method is used, as the binding member generates heat by itself, even if it is difficult to externally heat the contacting parts of both the binding member and the conductor of the coaxial cable, the binding member can be connected to the conductor of the coaxial cable.

The method of connecting the binding member to the electric connector is the method of connecting the above-mentioned binding member, which connects to or covers the outer conductor or the centered conductor, to the above-mentioned electric connector, and is to insert the binding member, which connects to or covers the outer conductor or the centered conductor, into the first or second electric contact, pass electricity between the first or second electric contact and the outer conductor or the centered conductor to melt the lead-free solder being contained in the binding member and connect the binding member to the first or second electric contact.

When this method is used, as the binding member generates heat by itself, even if it is difficult to externally heat the contacting parts of both the binding member and the electric contact, the binding member can be connected to the electric contact.

What is claimed is:

1. A binding device by itself in an initial condition thereof not solder-connected with a coaxial cable, the binding device being adapted for binding a prepared end of the coaxial cable, which includes an outer insulating cover, an outer conductor arranged coaxially inside the outer insulating cover with an exposed end portion of the outer conductor being exposed from the outer insulating cover, an inner insulation arranged coaxially inside the outer conductor, and an inner conductor arranged coaxially inside the inner insulation with an exposed end portion of the inner conductor being exposed from the inner insulation, wherein:

the binding device comprises a first binding member, the first binding member has a tubular shape with a hollow central hole in the initial condition in which the first binding member has not been melted and solder-connected onto the coaxial cable, the first binding member in the initial condition is configured and dimensioned to be arranged directly on, to be physically and electrically contacted directly with, and to circumferentially cover the exposed end portion of a selected conductor among the outer conductor and the inner conductor of the coaxial cable, and the first binding member consists of a lead-free ultrahigh-conductive plastic resin composite comprising a thermoplastic resin, a lead-free solder that has a melting temperature no higher than that of the thermoplastic resin so that the lead-free solder melts when the thermoplastic resin is plasticated, and a metal powder that assists a fine dispersion of the lead-free solder in the thermoplastic resin or a mixture of the metal powder and metal short fibers.

2. The binding device according to claim 1, wherein the first binding member in the initial condition is configured and dimensioned to be arranged directly on, to be physically and electrically contacted directly with, and to circumferentially cover the exposed end portion of the outer conductor of the coaxial cable.

3. The binding device according to claim 2, wherein the tubular shape of the first binding member in the initial condition is a cylindrical sleeve shape, and the hollow central hole of the first binding member is a cylindrical continuous through-hole.

4. The binding device according to claim 1, wherein the first binding member in the initial condition is configured and dimensioned to be arranged directly on, to be physically and electrically contacted directly with, and to circumferentially cover the exposed end portion of the inner conductor of the coaxial cable.

5. The binding device according to claim 4, wherein the tubular shape of the first binding member in the initial condition is a cylindrical cup shape, and the hollow central hole of the first binding member is a cylindrical blind hole that is open at only one end of the first binding member.

6. A method of connecting the binding device according to claim 1 to the coaxial cable, comprising:

arranging the first binding member, in the initial condition, on the exposed end portion of the selected conductor of the coaxial cable; and passing electricity through and between the first binding member and the selected conductor so as to melt the lead-free solder in the first binding member and thereby solder-connect the first binding member to the selected conductor of the coaxial cable.

7. The binding device according to claim 1, wherein:

the first binding member in the initial condition is configured and dimensioned to be arranged directly on, to be physically and electrically contacted directly with, and to circumferentially cover the exposed end portion of the outer conductor of the coaxial cable, the binding device further comprises a second binding member, the second binding member has a tubular shape with a hollow central hole in the initial condition in which the second binding member has not been melted and solder-connected onto the coaxial cable, the second binding member in the initial condition is configured and dimensioned to be arranged directly on, to be physically and electrically contacted directly with, and to circumferentially cover the exposed end portion of the inner conductor of the coaxial cable, and the second binding member consists of the lead-free ultrahigh-conductive plastic resin composite.

8. The binding device according to claim 7, wherein the tubular shape of the first binding member in the initial condition is a cylindrical sleeve shape, and the hollow central hole of the first binding member is a cylindrical continuous through-hole; and wherein the tubular shape of the second binding member in the initial condition is a cylindrical cup shape, and the hollow central hole of the second binding member is a cylindrical blind hole that is open at only one end of the second binding member.

9. A combination of the binding device according to claim 7 with the coaxial cable, wherein the first binding member in the initial condition is arranged directly on, is physically and electrically contacted directly with and circumferentially covers the exposed end portion of the outer conductor of the coaxial cable, and wherein the second binding member in the initial condition is arranged directly on, is physically and electrically contacted directly with and circumferentially covers the exposed end portion of the inner conductor of the coaxial cable.

10. An electric connector for a coaxial cable, incorporating the binding device according to claim 7, wherein the electric connector comprises:

an insulating housing;

a conductive first electric contact that has a first receiving port therein and that is secured in the insulating housing;

a conductive second electric contact that has a second receiving port therein and that is secured in the insulating housing;

the first binding member, in the initial condition, of the binding device according to claim 7 inserted into and contacted with the first receiving port of the first electric contact; and the second binding member, in the initial condition, of the binding device according to claim 7 inserted into and contacted with the second receiving port of the second electric contact.

11. A method of electrically connecting the electric connector according to claim 10 on the prepared end of the coaxial cable, comprising:

arranging the first binding member, in the initial condition, on the exposed end portion of the outer conductor;

arranging the second binding member, in the initial condition, on the exposed end portion of the inner conductor;

inserting the first binding member into the first receiving port of the first electric contact;

inserting the second binding member into the second receiving port of the second electric contact; and carrying out at least one of: a) passing electricity through and between the first electric contact, the first binding member and the outer conductor so as to melt the lead-free solder in the first binding member and thereby solder-connect the first binding member to the first electric contact; and b) passing electricity through and between the second electric contact, the second binding member and the inner conductor so as to melt the lead-free solder in the second binding member and thereby solder-connect the second binding member to the second electric contact.

* * * * *